United States Patent
Vats et al.

(10) Patent No.: US 11,942,365 B2
(45) Date of Patent: Mar. 26, 2024

(54) MULTI-REGION DIFFUSION BARRIER CONTAINING TITANIUM, SILICON AND NITROGEN

(71) Applicant: EUGENUS, INC., San Jose, CA (US)

(72) Inventors: Vinayak Veer Vats, San Ramon, CA (US); M. Ziaul Karim, San Jose, CA (US); Bo Seon Choi, Yongin-si (KR); Somilkumar J. Rathi, San Jose, CA (US); Niloy Mukherjee, San Ramon, CA (US)

(73) Assignee: Eugenus, Inc., San Jose, CA (US)

( * ) Notice: Subject to any disclaimer, the term of this patent is extended or adjusted under 35 U.S.C. 154(b) by 925 days.

(21) Appl. No.: 15/994,848

(22) Filed: May 31, 2018

(65) Prior Publication Data

US 2018/0350657 A1    Dec. 6, 2018

Related U.S. Application Data

(63) Continuation-in-part of application No. 15/612,853, filed on Jun. 2, 2017.

(51) Int. Cl.
   C23C 16/42    (2006.01)
   C23C 16/34    (2006.01)
   (Continued)

(52) U.S. Cl.
   CPC .......... H01L 21/7685 (2013.01); C23C 16/34 (2013.01); C23C 16/345 (2013.01);
   (Continued)

(58) Field of Classification Search
   CPC ................................ C23C 16/34; C23C 28/00
   See application file for complete search history.

(56) References Cited

U.S. PATENT DOCUMENTS 5,104,694 A * 4/1992 Saito ................. H01L 21/76879
                                                       427/255.393
5,597,745 A    1/1997 Byun et al.
(Continued)

FOREIGN PATENT DOCUMENTS

JP    H11-150084 A    6/1999
JP    2001-144032 A    5/2001
(Continued)

OTHER PUBLICATIONS

International Search Report and Written Opinion dated Sep. 21, 2018 in corresponding PCT Application No. PCT/US2018/035470; 10 pages.
(Continued)

Primary Examiner — Joseph A Miller, Jr.
(74) Attorney, Agent, or Firm — Knobbe, Martens, Olson & Bear, LLP

(57) ABSTRACT

The disclosed technology generally relates to semiconductor structures and their fabrication, and more particularly to diffusion barrier structures containing Ti, Si, N and methods of forming same. A method of forming an electrically conductive diffusion barrier comprises providing a substrate in a reaction chamber and forming a titanium silicide (TiSi) region on the substrate by alternatingly exposing the substrate to a titanium-containing precursor and a first silicon-containing precursor. The method additionally comprises forming a titanium silicon nitride (TiSiN) region on the TiSi region by alternatingly exposing the substrate to a titanium-containing precursor, a nitrogen-containing precursor and a second silicon-containing precursor. The method can optionally include, prior to forming the TiSi region, forming a titanium nitride (TiN) region by alternatingly exposing the substrate to a titanium-containing precursor and a nitrogen-containing precursor.

30 Claims, 4 Drawing Sheets

(51) Int. Cl.
    *C23C 16/455* (2006.01)
    *C23C 28/00* (2006.01)
    *H01L 21/02* (2006.01)
    *H01L 21/285* (2006.01)
    *H01L 21/768* (2006.01)
    *H01L 23/532* (2006.01)

(52) U.S. Cl.
    CPC ........ *C23C 16/42* (2013.01); *C23C 16/45527* (2013.01); *C23C 16/45529* (2013.01); *C23C 28/00* (2013.01); *C23C 28/321* (2013.01); *C23C 28/34* (2013.01); *C23C 28/345* (2013.01); *C23C 28/36* (2013.01); *H01L 21/02068* (2013.01); *H01L 21/28518* (2013.01); *H01L 21/28562* (2013.01); *H01L 21/76841* (2013.01); *H01L 23/53266* (2013.01); *H01L 21/76846* (2013.01)

(56) References Cited

U.S. PATENT DOCUMENTS

| | | | |
|---|---|---|---|
| 6,911,391 B2 * | 6/2005 | Yang | C23C 16/42 |
| | | | 438/653 |
| 9,099,473 B2 | 8/2015 | Kim et al. | |
| 9,159,608 B2 | 10/2015 | Park et al. | |
| 2001/0045660 A1 | 11/2001 | Tsubouchi et al. | |
| 2002/0123216 A1 * | 9/2002 | Yokoyama | H01L 21/76877 |
| | | | 257/E21.585 |
| 2002/0168468 A1 | 11/2002 | Chou et al. | |
| 2002/0197856 A1 | 12/2002 | Matsuse et al. | |
| 2003/0143841 A1 | 7/2003 | Yang et al. | |
| 2003/0176062 A1 * | 9/2003 | Doan | H01L 21/76841 |
| | | | 257/E21.171 |
| 2004/0115930 A1 | 6/2004 | Lee | |
| 2006/0183301 A1 * | 8/2006 | Yeom | H01L 21/3141 |
| | | | 257/E21.171 |
| 2009/0111264 A1 | 4/2009 | Yang et al. | |
| 2010/0035425 A1 | 2/2010 | Ryu et al. | |
| 2010/0102417 A1 | 4/2010 | Ganguli et al. | |
| 2010/0151681 A1 | 6/2010 | Knapp et al. | |
| 2010/0190321 A1 * | 7/2010 | Oh | H01L 45/124 |
| | | | 257/E47.005 |
| 2012/0108079 A1 | 5/2012 | Mahajani | |
| 2015/0050806 A1 | 2/2015 | Park et al. | |
| 2015/0206756 A1 | 7/2015 | Gandikota et al. | |
| 2015/0279683 A1 | 10/2015 | Harada | |
| 2018/0347040 A1 | 12/2018 | Vats et al. | |

FOREIGN PATENT DOCUMENTS

| | | |
|---|---|---|
| JP | 2015-193878 | 11/2015 |
| KR | 10-2003-0002863 | 1/2003 |
| KR | 10-2003-0003322 | 1/2003 |
| TW | 311248 | 7/1997 |
| TW | 439271 | 6/2001 |

OTHER PUBLICATIONS

Office Action dated Jun. 29, 2022 in corresponding Japanese Application No. 2019-560739; 13 pages.
Notice of Allowance with Search Report dated Oct. 5, 2022 in corresponding Taiwan Application No. 107119067.
Office Action dated Mar. 10, 2023 in corresponding Chinese Application No. 201880034943.2; 9 pages.
Office Action dated Mar. 14, 2023 in corresponding Korean Application No. 10-2019-7037530; 17 pages.

* cited by examiner

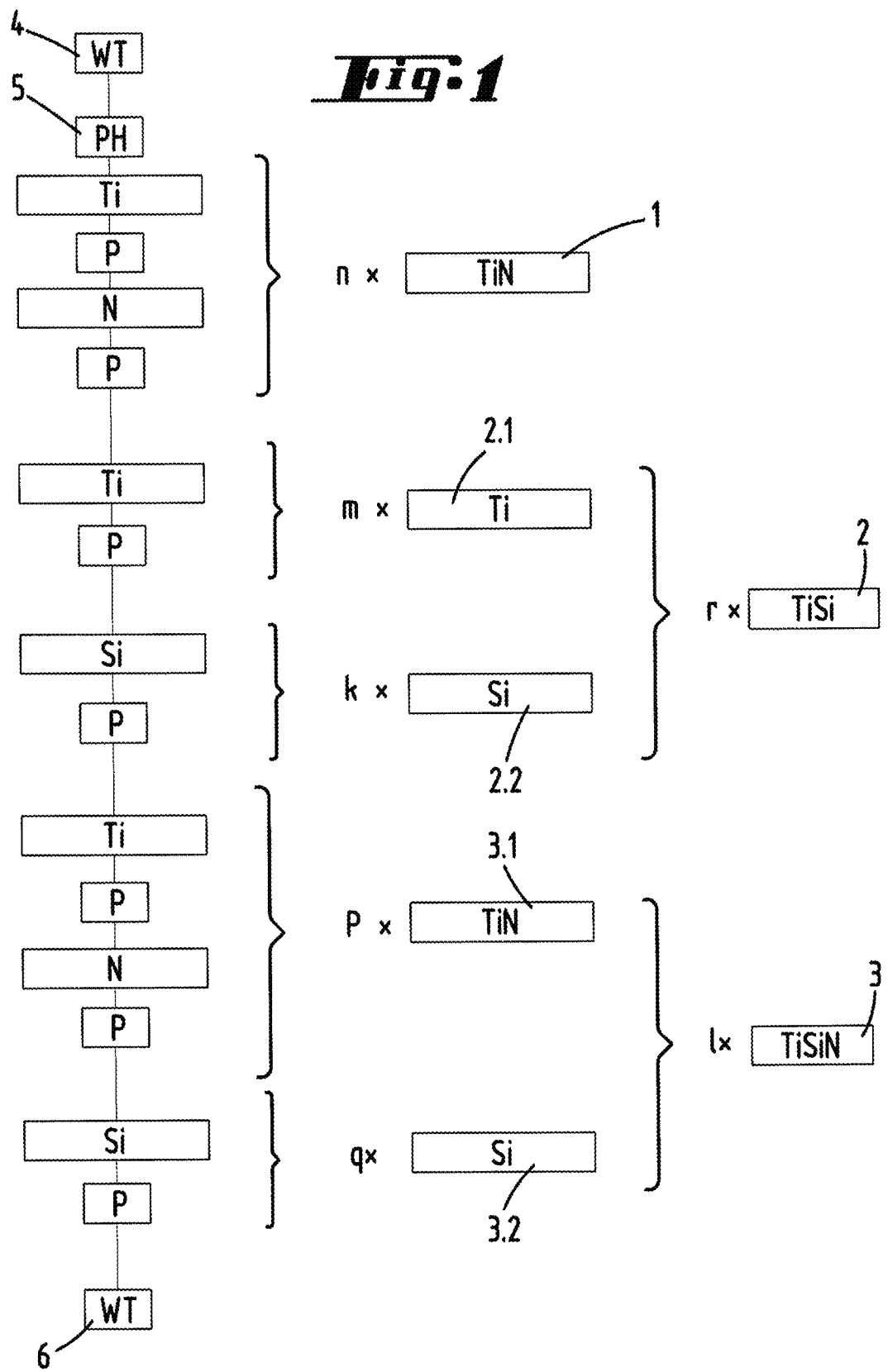

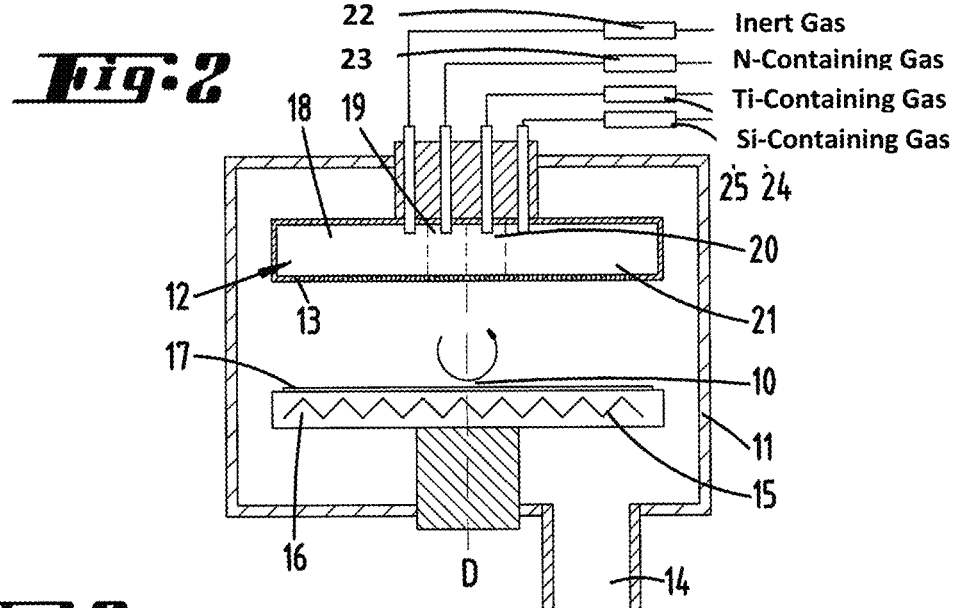
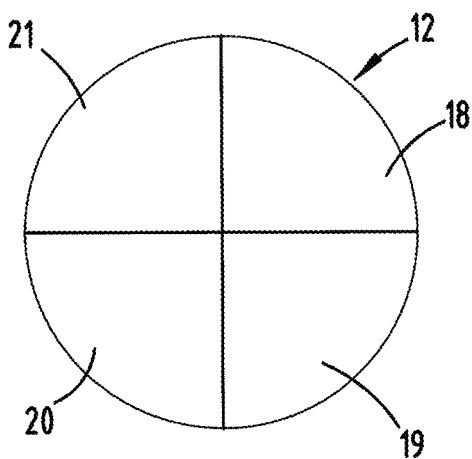
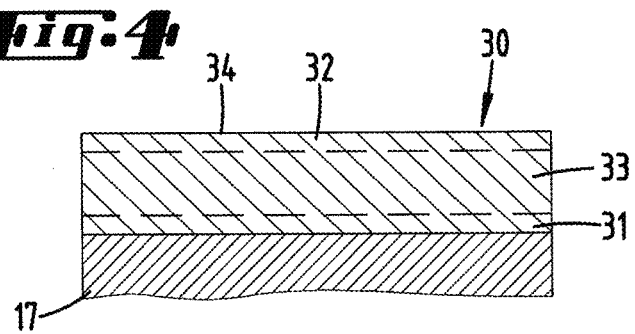

MULTI-REGION DIFFUSION BARRIER CONTAINING TITANIUM, SILICON AND NITROGEN

CROSS REFERENCE TO RELATED APPLICATIONS

This application is a continuation-in-part of U.S. patent application Ser. No. 15/612,853, filed Jun. 2, 2017, entitled "TiSiN Coating Method," the content of which is incorporated herein by reference in its entirety.

BACKGROUND

Field

The disclosed technology generally relates to semiconductor structures and their fabrication, and more particularly to diffusion barrier structures containing Ti, Si, N and methods of forming same.

Description of the Related Art

In atomic layer deposition (ALD), a layer consisting of a plurality of chemical elements is deposited on a substrate in several successive cycles. Reaction gases containing at least one element that is to be deposited in the layer are used in this process. In these cycles, layers of the same elements or a group of elements are deposited, layer by layer. A reaction gas is introduced into the process chamber in each cycle and remains in the process chamber until the surface of the substrate has become saturated with adsorbed or chemisorbed species of the reaction gas. In a subsequent flush or purge step, the residues of the process gas are removed from the process chamber and the same reaction gas or another reaction gas is introduced into the process chamber. The deposition process takes place at suitable temperatures at which the desired chemical reactions take place on the substrate surface. A decomposition reaction of the reaction gas may take place on the substrate surface. Volatile reaction products are removed from the process chamber with the flushing gas.

Diffusion barrier structures are used in some semiconductor devices to suppress undesirable atomic migration between different regions of the devices during or after their fabrication. Some diffusion barrier structures are formed using atomic layer deposition. In some semiconductor devices that include a diffusion barrier as part of a layer stack or sequence in an electronic component, for example, a memory component made on silicon substrates, the diffusion barrier not only serves to limit atomic diffusion but also as an electrically conductive layer. Such a diffusion barrier may be used, for example, for forming a contact. In some semiconductor technologies, a TiN process and a SiN process are sequentially conducted. The individual cycles are carried out several times one after the other in such a sequence and in such relative frequencies that a TiSiN layer is formed as a whole.

The diffusion resistance of the layer can be increased by increasing the silicon content. However, when the silicon content is increased in the known process, the electrical resistance of the deposited layer increases at the same time, so that the properties of the layer are inferior when used as a contact layer.

US 2015/0279683 and U.S. Pat. No. 6,911,391 also relate to a method for deposition of TiSiN layers on substrates.

Such a method is described in US 2015/0050806 A1.

SUMMARY

One object of the disclosed technology is to provide a diffusion barrier structure that serves to provide diffusion resistance while at the same time providing high electrical conductivity. In various embodiments, the diffusion barrier structures according to embodiments comprise electrically conductive multi-region or multi-layer diffusion barrier structures.

This object is achieved by various embodiments defined in the claims, wherein the dependent claims are not just advantageous refinement of the method defined in the independent claim but also constitute independent approaches to solving the problem, wherein individual subfeatures of the independent claims also have independent inventive significance.

In a first aspect, a method of forming a diffusion barrier structure comprising three regions is disclosed. According to the method, after a heating step following transport of the substrate into the process chamber, a first region or layer comprising TiN is deposited on a substrate, e.g., a silicon-containing substrate, and/or on a layer already deposited on the substrate, e.g., a polysilicon layer formed on the substrate. Next, a second region comprising a nitrogen-free region or layer, e.g., a layer sequence of Ti and Si is deposited. Then, a third region comprising TiSiN region or layer or layer sequence is deposited on the TiSi layer. The method takes place in three chronologically successive steps, each step being carried out at least once, preferably at least one of these steps or all of these steps being carried out several times in succession.

In the first step, a cycle is carried out n times for deposition of TiN, where each cycle includes first injecting a reaction gas that contains titanium into the process chamber, followed by flushing the process chamber with an inert gas, followed by injecting a reaction gas containing nitrogen into the process chamber and finally flushing the process chamber with an inert gas. Nitrogen or argon or some other suitable noble gas or any other suitable gas may be used as the inert gas; n may be 1 or greater, for example, at least 5.

The second step may include two substeps, each of which is carried out at least once, but preferably is carried out multiple times. In a first substep of the second step, a reaction gas containing titanium is injected into the process chamber and then the process chamber is flushed with an inert gas. The first substep may be carried out m times, where m=1 or greater, for example, at least 5. In a second substep of the second step, a reaction gas containing silicon is first injected into the process chamber and then the process chamber is flushed with an inert gas. This second substep may be carried out k times, where k may be 1 or greater, for example, at least 5. The second step, in which a nitrogen-free area of the coating is preferably deposited, is carried out r times, where r may be 1 or greater, for example, at least 10.

The third step also includes two substeps, wherein TiN is deposited in a first substep. To do so, the first substep similar to the first step described above is carried out p times. In the first substep of the third step, a reaction gas containing titanium is first injected into the process chamber, and the process chamber is subsequently flushed with an inert gas. Next, a reaction gas containing nitrogen is injected into the process chamber, and the process chamber is subsequently flushed with an inert gas. This first substep of the third step is carried out p times, where p=1 or more, for example, at least 2. In the first substep of the third step, a reaction gas containing titanium is first injected into the process chamber. The process chamber is then flushed with an inert gas. Next, a reaction gas containing nitrogen is injected into the process chamber and then the process chamber is flushed with an inert gas. In the first substep of the third step, the coating thus includes an area containing nitrogen. A second substep and in particular the last substep, in which silicon is deposited by injecting a reaction gas that contains silicon into the process chamber is carried out following the first substep, wherein, here again, a cycle including a sequence of injecting the reaction gas containing silicon into the process chamber followed by flushing the process chamber with the inert gas is carried out q times, where q=1 or greater, for example, at least 5. The third step, in which TiSiN is deposited on the whole, can be carried out r times, where r=1 or greater, for example at least 10. In some implementations of the third step, the reaction gas of the last substep essentially does not contain nitrogen. The skilled artisan will appreciate that any diatomic nitrogen used as a carrier gas may not form part of the reaction gas, as $N_2$ does not typically react at the temperatures of the processes described herein.

As a result of the method according to some embodiments, a first layer, area or region, which contains TiN or Ti—N bonds, is formed on a substrate or a layer of the substrate containing silicon in the first step. The first layer, area or region may be referred to herein as a first boundary or border region. In addition, a second layer, area or region, which may be referred to herein as a core area or region, is formed on the first area or region, in which Si—Si bonds or Si—Ti bonds may be formed. These bonds have a much lower bond energy (approximately 100 eV) than the Ti—N bond in which the bond energy is approximately 450 eV. This method is carried out in particular in such a way that a titanium silicide, such as $TiSi_2$, is formed in different phases and has a lower electrical resistance than TiSiN, for example. To this extent, it is advantageous if a nitrogen-free component is deposited in the last substep of the third step, wherein the reaction gas does not contain any nitrogen component for this purpose which does not take part in the chemical reaction although $N_2$ can. In the last step a third layer, area or region of the coating is deposited, this being a second boundary or border region containing nitrogen. The individual layer thicknesses of the three layers are preferably 2 Å to 200 Å with the sum total of the three layers being 5 Å to 500 Å. All three layers could be repeated in situ and in sequence to yield film thicknesses of 5 Å to 500 Å.

Combinations of suitable gaseous compounds of titanium, silicon and nitrogen are used for forming various regions of the barrier structure according to embodiments. For example, $TiCl_4$, tetrakis(dimethylamino)titanium (TDMAT) or tetrakis(diethylamino)titanium (TDEAT) may be used as titanium-containing reaction gases. Dichlorosilane ($SiH_2Cl_2$) or $SiHCl_3$, $SiCl_4$, $SiH_4$ or $Si_2H_6$ may be used as a reaction gas containing silicon. $NH_3$ or monomethylhydrazine (MMH or $CH_3(NH)NH_2$) may be used as a reaction gas containing nitrogen. This method begins with heating of the substrate to a temperature of 400° C. to 700° C. at a total pressure in the range between 5 millibar and 0.6 millibar (equivalent to 0.5 mTorr to 7.5 mTorr). Next the three steps described above are carried out. After cooling the substrate, it is removed from the process chamber.

As used herein, the term substrate can refer to a semiconductor substrate such as a silicon wafer. In some examples, the substrate may be a blank wafer that may be p-doped or n-doped. In some examples, the substrate may have formed thereon a blanket film such as silicon oxide, silicon nitride or polycrystalline silicon. In some examples, the term substrate refers to a prestructured and/or precoated wafer on which patterned or unpatterned intermediate structures may have been formed thereon. The patterned or unpatterned intermediate structures may include, for example, a silicon-containing layer that may have been deposited, for example, a layer of a memory device or module. For example, the silicon-containing layer may be a polycystalline silicon layer having doped regions. Various layers or regions according to embodiments can subsequently be formed on substrates. After forming diffusion barrier structures according to embodiments comprising a TiSiN region according to embodiments, the various layers or regions can be further processed, e.g., patterned and electrically connected by, for example, wires made of tungsten and copper or the like.

The coating is preferably deposited in a reactor that can be evacuated using a vacuum system. Inside the reactor there is a gas inlet element for introducing the reaction gases and/or the inert gas. The gas inlet element may be in the form of a shower head. It may have a plurality of sectors or segments, wherein the segments or sectors form separate chambers into which the reaction gas containing Ti, the reaction gas containing Si or the reaction gas containing N can be injected separately from one another. The gas inlet element may extend over the total area extent of the substrate which sits on a heated susceptor. The gas inlet element may be cooled but it may also be heated. The substrate is preferably sitting on a susceptor which may be heated by a plurality of heating elements so that the susceptor has a plurality of heating zones which may be heated independently of one another. A uniform temperature profile can be adjusted on the substrate surface in this way. In particular, a temperature profile with a minimal lateral temperature gradient can be adjusted on the substrate surface.

In another aspect, the disclosed technology relates to a coating applied to a substrate and having a first boundary or border region with which the coating is adjacent to the substrate or to a layer applied to the substrate. The coating also has a second boundary or border region which is opposite the first borderline region and to which a metallic or metal ceramic contact may be applied. The second border region has a surface area, which may come in contact with a contact material, such as tungsten. Between the first boundary or border region and the second boundary or border region there is a core region. The coating according to embodiments has the following properties: the first boundary or border region has a higher nitrogen concentration than the core region. The second boundary or border region has a higher nitrogen concentration than the core region. The core region may be free of nitrogen in some embodiments. The surface area of the second boundary or border region may be free of nitrogen in some embodiments.

In a third aspect, a method of forming an electrically conductive diffusion barrier comprises providing a substrate in a reaction chamber and forming a titanium silicide (TiSi) region on the substrate by alternatingly exposing the substrate to a first titanium-containing precursor and to a first silicon-containing precursor. The method additionally comprises forming a titanium silicon nitride (TiSiN) region on the TiSi region by alternatingly exposing the substrate to a second titanium-containing precursor, a nitrogen-containing precursor and a second silicon-containing precursor.

In a fourth aspect, a method of forming an electrically conductive diffusion barrier comprises providing a substrate comprising a silicon surface in a thermal reaction chamber and forming a titanium silicide (TiSi) region on the silicon surface by alternatingly exposing the substrate to a first silicon-based precursor followed by a first titanium-containing precursor. The method additionally comprises forming a titanium silicon nitride (TiSiN) region on the TiSi region by alternatingly exposing the substrate to a second titanium-containing precursor, a nitrogen-containing precursor and to a second silicon-containing precursor, wherein the substrate is exposed to the second silicon-containing precursor as a last precursor in forming the TiSiN region.

In a fifth aspect, a semiconductor structure comprises a substrate comprising a silicon-containing surface, a titanium silicide (TiSi) region on the silicon-containing surface, and a titanium silicon nitride (TiSiN) region formed on the TiSi region. The TiSiN region comprises a higher silicon concentration at a surface region compared to an interface between the TiSi region and the TiSiN region.

BRIEF DESCRIPTION OF THE DRAWINGS

The disclosed technology is explained in greater detail below on the basis of exemplary embodiments, in which:

FIG. 1 is a block diagram illustrating process steps for forming an electrically conductive multi-region diffusion barrier structure in chronological succession, according to embodiments;

FIG. 2 is a cross-sectional view of an example reactor configured for forming the electrically conductive multi-region diffusion barrier structure according to embodiments;

FIG. 3 is a cross-sectional view of a gas inlet element of the reactor illustrated in FIG. 2;

FIG. 4 is a cross-sectional view of an electrically conductive multi-region diffusion barrier structure deposited on a substrate using a method according to embodiments.

DETAILED DESCRIPTION

Figure 5:
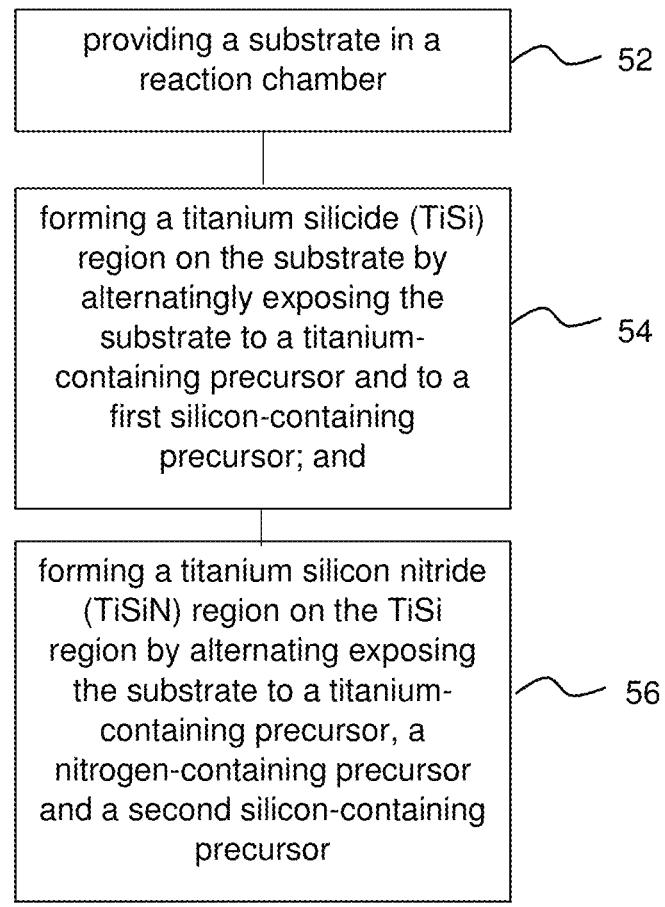
FIG. 5 is a block diagram illustrating process steps for forming an electrically conductive diffusion barrier structure according to embodiments.

FIG. 2 shows schematically the structure of a coating device arranged inside a reactor housing 11 that is sealed airtight. A plurality of inlet lines is provided such that it is possible to feed a gas stream into a gas inlet element 12 through each of these feeder lines. The gas inlet element 12 has a plurality of gas outlet openings 13 through which the gas fed into the gas inlet element 12 can enter a process chamber 10. The bottom of the process chamber 10 is formed by the top side of a susceptor 16 on which the substrate 17 to be coated sits. The susceptor 16 can be heated to a process temperature by means of a heater 15. The susceptor 16 may be rotated about an axis of rotation D in its plane of extent. The rotation takes place relative to the gas inlet element 12. A gas outlet 14 to which a vacuum pump is connected is provided.

An inert gas can be fed into a chamber 18 of the gas inlet element 12 through a feeder line by means of a first mass flow controller 22. A gas containing nitrogen can be fed by means of a mass flow controller 23 into a chamber 19 separated from the former by an airtight seal. A gas containing titanium can be fed into a chamber 20 separated from the former with an airtight seal, by means of a mass flow controller 24. A gas containing silicon can be fed into a chamber 21 of the gas inlet element 12 by means of a mass flow controller 25.

FIG. 3 shows as an example the spatial arrangement of the individual chambers 18, 19, 20, 21 in the gas inlet element 12. The chambers may be arranged like spokes. When the substrate 17 is rotated relative to the gas inlet element 12, the reaction gas or inert gas fed into the process chamber 10 comes in contact with all regions of the surface of the substrate 17.

As configured, the reaction chamber 20 is configured to form different regions of the multi-region barrier structures according to various embodiments in situ in the same reaction chamber without removing the substrate therefrom. Furthermore, the reaction chamber 20 is configured to form the multi-region barrier structure using thermal deposition processes, e.g., thermal atomic layer deposition (ALD) or thermal chemical vapor deposition (CVD) or hybrids thereof.

Semiconductor components for memory elements or the like have electrically active or passive layers or regions containing silicon formed in or on a substrate. The active layers or regions may contain doped regions that may form part of active semiconductor devices such as transistors or diodes, and passive layers or regions may contain doped regions that may form part of passive semiconductor devices such as resistors or capacitors. The active semiconductor layers can be electrically connected to the outside world through die-level electrical connections such as bond wires, for example. The electrical connections between the active layers and the bond wires in turn include integrated metallization and conductive structures including contacts, vias and access lines. In addition to conducting electrical signals between the active layers and the integrated metallization, some of the conductive structures serve multiple purposes, e.g., serving as a diffusion barrier while also providing Ohmic contact and/or providing low in-layer resistivity over distances. One example of such conductive structure is an Ohmic barrier layer disclosed in U.S. Pat. No. 9,099,473, which is incorporated by reference herein in its entirety. U.S. Pat. No. 9,099,473 discloses an Ohmic barrier layer formed of a metal silicon nitride that is present in an array region and a periphery region of a dynamic random access memory (DRAM) device. In the periphery region, the Ohmic barrier layer is disclosed as being formed between a polycrystalline silicon layer with doped regions and a metal layer (e.g., tungsten), as part of a bitline stack. In the array region, the Ohmic barrier layer is disclosed as being formed between a gate electrode and a gate contact metal layer (e.g., tungsten) as part of a gate/contact stack.

The inventors have found that electrically conductive diffusion barrier structures comprising a multi-region or a multilayer structure according to embodiments disclosed herein can improve one or more of the diffusion barrier function, an in-layer electrical resistivity and an Ohmic contact at reduced overall thicknesses and simplified process design. As a diffusion barrier, the diffusion barrier structures can suppress atomic diffusion including, for example, atomic diffusion of dopant atoms such as boron and/or phosphorus in one direction, such as from a doped single crystalline or polycrystalline silicon layer. The diffusion barrier structures can also suppress atomic diffusion of atoms associated with formation of a metal on the diffusion barrier structure in the other direction, such as diffusion of fluorine atoms from process gases used to from tungsten-based contacts on the diffusion barrier structures. Furthermore, in addition to reducing the electrical resistivity in one direction, for example a vertical direction through the thickness of the diffusion barrier structure, the diffusion barrier structure according to embodiments can also reduce electrical resistivity in another direction, for example a horizontal direction, as discussed herein.

As described herein, ordering or enumerating terms such as "first" and "second" shall not imply that the term following them are different. For example, a first titanium-containing precursor and a second titanium-containing precursor can be the same or different. Similarly, a first silicon-containing precursor and a second silicon-containing precursor can be the same or different.

As described herein, a compound referred to by its constituent elements without specific stoichiometric ratios thereof shall be understood to encompass all possible non-zero concentrations of each element unless explicitly limited. For example, titanium silicide (TiSi) shall be understood to encompass all possible stoichiometric and nonstoichiometric compositions of titanium silicide, including $TiS_{i2}$ TiSi, $Ti_5Si_4$ and $Ti_3Si$. Similarly, titanium nitride (TiN) shall be understood to encompass all possible stoichiometric and nonstoichiometric compositions of titanium nitride, including TiN, $Ti_3N_4$, $Ti_4N_3$, $Ti_6N_5$, $Ti_2N$ and $TiN_2$. Similarly, titanium silicon nitride (TiSiN) shall be understood to encompass all possible stoichiometric and nonstoichiometric compositions of titanium silicon nitride, which can be expressed by a general formula $Ti_xSi_yN$. However, such compound representations without stoichiometric ratios are meant to include all listed elements and exclude unlisted elements other than impurity concentrations (such as less than 0.1 at. %).

According to various embodiments, a substrate can include silicon, such as monocrystalline silicon or polycrystalline silicon. The substrate can also include silicon-containing compounds, for example SiGe, and buried insulators, such as silicon-on-insulator (SOI) substrates. The substrate can include other materials, including or II-VI compound semiconductor materials or sapphire.

Barrier Structures Comprising Three Regions

In the following, in reference to FIGS. 1 and 4, multilayer barrier structures comprising three regions are described. According to these embodiments, a TiSiN coating, which can be applied between a contact and the active semiconductor layer containing silicon, can be designed so that the layer has a lower electrical resistance while at the same time forming a high diffusion barrier which inhibits the contact metal applied to the TiSiN coating from diffusing into the silicon layer. For deposition of this layer, an ALD method (atomic layer deposition) can be used for one or more regions of the barrier structure according to embodiments. In this method, reaction gases are fed into the process chamber 10 in alternation with an insert gas for flushing the process chamber 10. This takes place by introducing the respective gas into the cavity in the gas inlet element 12 and discharging the gas from the plurality of gas outlet openings 13 arranged like a sieve into the process chamber 10. The reaction gas is fed into the process chamber 10 in such a concentration and over such a period of time until the surface of the substrate 17 applied to the susceptor 16 has become saturated with the reaction gas and/or a reaction product of the reaction gas, for example, a fragment species or decomposition product of the reaction gas. Then the gas residues are flushed out of the process chamber 10. This is accomplished by introducing an inert gas into the process chamber 10, wherein the inert gas may be nitrogen or a noble gas.

According to embodiments, the coating is applied in a number of successive coating steps, each of which may in turn comprise substeps and is preferably repeated several times. The process is carried out in such a way that Si—Si bonds or Si—Ti bonds are formed in the core region or area of the coating so that the coating comprises TiSi which has a lower electrical resistance than TiSiN. On the other hand, however, the process is carried out in such a way that the interface facing underneath layer and the interface of the coating having the subsequent layer have a higher nitrogen content than the core region of the coating. Referring to FIG. 4, the coating 30 can comprise or consist essentially of three regions, where a lower interface is connected to or contacts the substrate 17 surface and/or the active layer containing the silicon. In some embodiments, the lower interface region 31 comprises or consists essentially of TiN. The core region 33 of the coating comprises or consists essentially of Ti and Si. An upper interface region 32 comprises or consists essentially of TiSiN. An upper surface 34 of the upper interface region 32 can be subsequently contacted by a conductor, such as a tungsten (W) plug.

The conduct of the process is explained in greater detail below with reference to the accompanying FIG. 1 and FIG. 2. First, in a substrate transport step (wafer transport) 4, the substrate 17 is introduced into the process chamber 10 where the substrate 17 rests on the susceptor 16. By heating the susceptor 16 with a heater 15 having a plurality of heating zones, the substrate is heated to a process temperature. This takes place by passing an electric current through a wire resistor of the heater 15, for example.

In a first process step 1, TiN is deposited. To do so, a reaction gas containing Ti is first introduced into the process chamber 10 until the surface of the substrate 17 is saturated with the process gas (Ti). Then residues of the reaction gas containing Ti or its reaction products which do not remain on the surface of the substrate 17 are flushed out of the process chamber 10 by means of an inert gas (P). Next, a reaction gas containing nitrogen is fed into the process chamber until the surface of the substrate 17 has been saturated with it (N). Next by introducing the inert gas, the reaction gas containing nitrogen is flushed out of the process chamber 10 (P). These four successive sequences form a first step 1 that is repeater n times resulting in a layer preferably 10 A thick but up to 50 nm thick. The skilled artisan will appreciate that in variants of the process, the relative frequency of the Ti and N phases can be varied and individual phases (Ti and/or N) can be repeated in sequence, rather than strict alternation of the two, in order to obtain the desired relative frequency and obtain the desired stoichiometry, depending in part upon the selected reactants, their reactivity and susceptibility to stearic hindrance effects.

In a second following step 2 the TiSi core material is deposited. This second step 2 comprises or consists essentially of two substeps 2.1, 2.2, wherein Ti is deposited in the first substep and Si is deposited in the second substep. In the first substep 2.1, a reaction gas containing Ti is first introduced into the process chamber 10 a total of m times and then gas residues are flushed out of the process chamber 10 by introducing an inert gas (P). Following this first substep 2.1 of the second step 2 which is carried out at least once but preferably several times, the second substep 2.2 is performed. In this second substep 2.2, a reaction gas containing silicon is first fed into the process chamber 10 (Si) and then the process chamber 10 is flushed by introducing an inert gas (P). The second substep 2.2 is carried out a total of k times, where k is preferably greater than 1.

The second step 2 comprising or consisting essentially of the two substeps 2.1 and 2.2 is preferably carried out a total of r times until the target layer thickness of a core layer, which comprises or consists essentially of TiSi and is essentially free of nitrogen is deposited. The TiSi layer thickness may also be preferably 10 A thick but up to 50 nm. The skilled artisan will appreciate that in variants of the second step 2 process, the relative frequency of the substeps 2.1 and 2.1 can be varied and individual substeps 2.1 and/or 2.2 can be repeated in sequence, rather than strict alternation of the two, in order to obtain the desired relative frequency and obtain the desired stoichiometry, depending in part upon the selected reactants, their reactivity and susceptibility to stearic hindrance effects.

The second step 2 is followed by a third step 3 in which TiSiN is deposited. The third step comprises or consists essentially of two substeps 3.1, 3.2 which follow one another and can be carried out a total of 1 times where 1 is 1 or preferably greater than 1.

In some embodiments, the first substep 3.1 of the third step 3 corresponds essentially to the first step 1. TiN is deposited, so a reaction gas containing titanium is first fed into the process chamber 10 (Ti), which is then flushed by introducing an inert gas (P). Following that a reaction gas containing nitrogen is introduced into the process chamber 10 (N) whereupon the process chamber 10 is again flushed by introducing an inert gas (P). The substep 3.1 can be carried out a total of p times where p=1 or is preferably greater than 1. However, embodiments are not so limited and in other embodiments, the first substep 3.1 and first step 1 can be different.

In some embodiments, the second substep 3.2 of the third step 3 is carried out without the use of a reaction gas containing N. First the reaction gas containing silicon is fed into the process chamber 10 (Si). Then the process chamber 10 is flushed by introducing the inert gas (P), whereupon the second substep 3.2 of the third step 3 can be carried out a total of q times where q=1 or is preferably greater than 1. Not using a reaction gas containing N in the second substep 3.2 can be advantageous in reducing contact resistance and/or enhancing the diffusion barrier effect of the resulting TiSiN layer. The resulting TiSiN layer may have a higher silicon content near the surface, on which a metal may be subsequently deposited. For example, when tungsten-based metal is formed on the barrier structure using a fluorine containing precursor, the resulting diffusion barrier structure can effectively suppress diffusion of fluorine, while also simultaneously forming a more Ohmic interface. The skilled artisan will appreciate that in variants of the third step 3 process, the relative frequency of the substeps 3.1 and 3.1 can be varied and individual substeps 3.1 and/or 3.2 can be repeated in sequence, rather than strict alternation of the two, in order to obtain the desired relative frequency and obtain the desired stoichiometry, depending in part upon the selected reactants, their reactivity and susceptibility to stearic hindrance effects.

After cooling the process chamber 10, the substrate 17 is removed from the process chamber 10 in a transport step (wafer transport) 4.

The gases mentioned in the introduction are used as the reaction gases, for example, the reaction gas containing Ti may be $TiCl_4$, TDMAT or TDEAT and the reaction gas containing Si may be $SiH_2Cl_2$, $SiHCl_3$, $SiCl_4$, $SiH_4$ or $Si_2H_6$. The reaction gas containing N may be $NH_3$ or $CH_3(NH)NH_2$ (MMH). The inert gas may be $N_2$ or a noble gas.

Referring to FIG. 3, due to the use of a gas inlet element 12 having chambers 18, 19, 20, 21 arranged like sectors around a center, a uniform flow pattern can be achieved within the process chamber. The gas inlet element 12 which is in the form of a shower head can be cooled or heated. A thermal equilibrium can be established. The susceptor 16 may also be heated or cooled. The heater 15 is in particular a multizone heater, preferably two heaters being at different distances radially from the center are arranged around the center. The chambers 19 to 21 may each be flushed with the inert gas in the respective gas change so that no reaction gas remains there.

By means of SiN measurements or XPS measurements, it has been shown that the bonding energy between the individual atoms is much lower in the core region of the layer than in the two interfaces, thus indicating that TiSiN is formed only in the boundary regions and Si—Si and/or Si—Ti is formed in the core region.

FIG. 4 shows schematically a section through a coating 30 deposited on a substrate 17. The substrate 17 is shown only symbolically and includes a silicon wafer with a layer structure deposited on it, wherein the interface of the substrate 17 facing the coating 30 may be a surface of a layer containing silicon.

The coating 30 comprises or consists essentially of a first boundary region 31, which is deposited directly on the surface of the substrate 17, a core region 33, which is connected to the first boundary region 31 and a second boundary region 32, which has a surface 34 on which a conductive structure, e.g., a tungsten contact, may be formed for interconnecting active layers with integrated metallization.

The layer 30 deposited with the method described previously has a first interface or boundary region 31, which can have an elevated nitrogen concentration, wherein the nitrogen concentration in the first boundary region 31 is greater than that in the core region 33. The core region 33 is preferably essentially free of nitrogen. The second boundary region 32 can also have a higher nitrogen concentration than the core region 33. In some embodiments, the surface 34 can be relatively or essentially free of nitrogen, which can be facilitated by terminating the third step 3 with multiple sequential Si deposition of substeps 3.2.

In the first boundary region 31 and in the second boundary region 32, TiSiN compounds with a high bond energy are formed (TiN 455.6 eV). In the core region 33 essentially Si—Si bonds with a bond energy of 99.6 eV and Ti—Si bonds are formed. The coating 30 deposited by the method according to the embodiment has a high electrical conductivity and forms a highly effective diffusion barrier. It has an essentially crystalline property and a layer thickness of approximately 0.65 nm to 650 nm.

The preceding discussion serves to illustrate embodiments covered by the patent application as a whole, each also independently improving upon the prior art at least through the following combinations of features, wherein two, more or all of these combinations of features may also be combined further, namely:

In some embodiments, a method comprises coating a substrate 17 with a layer containing Ti, Si, N, where one or more regions of the layer is formed by ALD. According to the method, a reaction gas is fed into a process chamber 10 containing the substrate 17 in a plurality of successive steps 1, 2, 3 in one or more n, m, k, 1, p, q, r cycles and then a flushing gas is fed into the same process chamber, wherein TiN is deposited in a first step 1 with a reaction gas containing Ti and with a reaction gas containing N, in a second step 2 which follows the former step, TiSi is deposited with a reaction gas containing Ti and a reaction gas containing Si, and in a third step 3 following the second step 2, TiSiN is deposited with a reaction gas containing Ti, with a reaction gas containing N and with a reaction gas containing Si.

In some embodiments, the method includes a reaction vapor supply cycle comprising or consisting essentially of introducing the reaction gas containing Ti, flushing the process chamber 10 with an inert gas, feeding the reaction gas containing N and flushing the process chamber 10 with a reaction gas is carried n times in the first step 1, where n>1.

In some embodiments, in the second step 2, a first substep 2.1 comprises introducing the reaction gas containing Ti and then flushing the process chamber 10 with an inert gas is carried out m times, where m>1. and a second substep 2.2, in which the reaction gas containing Si is introduced into the process chamber 10 and then the process chamber 10 is flushed with the inert gas, is carried out k times, where k>1.

In some embodiments, the two substeps 2.1, 2.2 of the second step 2 are carried out r times in succession where r>1.

In some embodiments, in the third step 3, a first substep 3.1, in which the reaction gas containing Ti is introduced into the process chamber 10 and then the process chamber 10 is flushed with an inert gas, next the reaction gas containing N is introduced into the process chamber 10 and then the process chamber 10 is flushed with an inert gas is carried out p times where p>1, and in a second substep 3.2 the process gas containing Si is fed into the process chamber 10 and next the process chamber 10 is flushed with an inert gas wherein the second substep 3.2 is carried out q times in succession, where q>1.

In some embodiments, the third step 3 is carried out 1 times in succession where l>1.

In some embodiments, the reaction gas containing Ti is introduced at a partial pressure of less than $12 \times 10^{-3}$ millibar; the reaction gas containing Si and having a partial pressure between $1 \times 10^{-3}$ and $4 \times 10^{-3}$ millibar is introduced and/or the reaction gas containing N is introduced at a partial pressure between $9 \times 10^{-3}$ and $8 \times 10^{-1}$ millibar.

In some embodiments, the total pressure inside the process chamber 10 is in the range between 0.6 and 6 millibar and the steps 1, 2, 3 are carried out at temperatures in the range between 400° C. and 700° C., wherein the times for feeding the reaction gases in each substep or pulse are in the range between 0.4 and 60 seconds.

In some embodiments, the reaction gas containing Ti is $TiCl_4$, TDMAT or TDEAT and/or the reaction gas containing Si is $SiH_2Cl_2$, $SiHCl_3$, $SiCl_4$, $SiH_4$ or $Si_2H_6$ and/or the reaction gas containing N is $NH_3$ or MMH.

In some embodiments, a coating is formed in which the nitrogen content in the first and second boundary ranges 31, 32 is greater than that in the core region 33.

In some embodiments, a coating has the core region 33 that is essentially free of nitrogen.

In some embodiments, a coating has a surface 34 of the second boundary region facing away from the substrate 17 that is free of nitrogen.

Barrier Structures Comprising Two Regions

In the above, example barrier structures comprising three regions have been described, which can include a lower region comprising TiN, a core region comprising TiSi formed on the lower region, and an upper region comprising TiSiN formed on the core region, where the upper and lower regions have a higher relative nitrogen content compared to the core region. Example barrier structures comprising two regions are also possible, according to embodiments described herein.

Two-region barrier structures can be similar in some aspects to a barrier structure that would result when the lower region comprising TiN is omitted from the three-region barrier structure described above. For example, the barrier structure comprising two regions may include regions corresponding to the core region comprising TiSi formed on the substrate and the upper region comprising TiSiN formed on the core region, without having the lower region comprising TiN formed prior to forming the TiSi. The inventors have found that such barrier structures can provide improved barrier, contact and/or electrical conductivity at smaller thicknesses, when the combination of various features are implemented during fabrication, as described herein. In the following, unless explicitly described otherwise, any of the corresponding process and structural features described above with respect to the barrier structure comprising three regions can be implemented to fabricate the barrier structure comprising two regions. Thus, a detailed description of such corresponding features is omitted herein.

Figure 6:
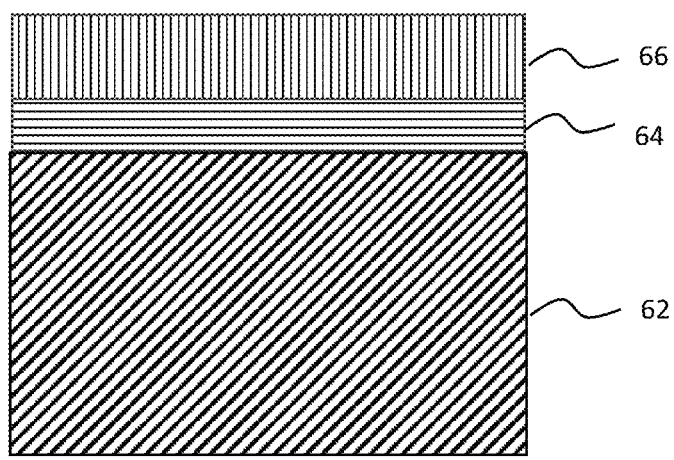
FIG. 6 is a cross-sectional view of an electrically conductive multi-region diffusion barrier structure formed on a substrate using a method according to embodiments.

Referring to FIG. 5, according to various embodiments, the method of forming a barrier structure comprising two regions comprises providing 52 a substrate in a reaction chamber, forming 54 a titanium silicide (TiSi) region on the substrate by alternatingly exposing the substrate to a first titanium-containing precursor and to a first silicon-containing precursor, and forming 56 a titanium silicon nitride (TiSiN) region on the TiSi region by alternating exposing the substrate to a second titanium-containing precursor, a nitrogen-containing precursor and a second silicon-containing precursor. FIG. 6 illustrates the resulting multi-region barrier structure, comprising the substrate 62, the TiSi region 64 and the TiSiN region 66.

The first titanium-containing precursor used for forming 54 the TiSi region can be the same or different from the titanium-containing precursor used for forming the core region 33 described above with respect to FIGS. 1 and 4. Other process parameters can be similar to those described above with respect to forming the core region 33 (FIG. 4). However, the inventors have found that particularly high performance barrier structures can be formed when the TiSi region 64 is formed using the first silicon-containing precursor which comprises an inorganic silane free of halides, e.g., monosilane ($SiH_4$) or dilsilane ($Si_2H_6$). Without being bound to any theory, when the substrate is exposed to such a silane as the silicon-containing precursor at relatively high temperatures, the saturation of the substrate surface with the silane may not be self-limiting due to absence of organic or halide ligands. Thus, the deposition rate and relative concentrations of Si and Ti may be modulated by the duration, pressure and temperature of the exposure. Accordingly, the amount of excess silicon may be controlled as an independent process parameter for tuning the electrical characteristics of the resulting TiSi layer. Put another way, stoichiometry of the TiSi region 64 can be controlled without modulating the frequency of the pulses (e.g., maintaining a 1:1 ratio of Si:Ti pulses) and thus much more efficiently. According to embodiments, these and other benefits can be realized when the TiSi region 64 is formed a relatively high substrate temperature of 400° C. to 800° C., 450° C. to 750° C., 500° C. to 700° C., 550° C. to 650° C., or a temperature in a range defined by any of these values, for instance about 600° C., according to embodiments. The partial pressures of the precursors, the total pressure in the reaction chamber and exposure times can have similar values as described above.

The resulting TiSi region 64 formed as the first region on the substrate provides various advantages. When the barrier structure is formed on n-doped or p-doped polycrystalline silicon, e.g., as part of a gate/contact stack or an access line (e.g., bitline) stack as described above, the resulting interface, which may include a lower Schottky barrier, can be appropriately tuned to lower the contact resistance (e.g., by lowering the Schottky barrier). The Schottky barrier may be lowered, e.g., by tuning the work function of the TiSi region at the interface with the substrate between, e.g., 4.0 eV-4.5 eV. For example, by controlling the amount of excess silicon that may be present through controlling the temperature, duration and pressure of exposure to the silane as described above, the work function of the resulting TiSi may be tuned to lower or minimize any Schottky barrier that may form between the TiSi region 64 and the underlying substrate 62 or a doped polycrystalline silicon formed on the substrate 62. In addition, the amount of excess silicon can also be tuned to reduce the in-layer resistivity of the TiSi region 64, e.g., below about 600 µOhm-cm, 500 µOhm, or 400 µOhm-cm. The lower contact resistance, as well as other advantages including higher lateral conductivity and/or improved barrier performance compared to prior art barrier structures, results from one or more various processing conditions, as described herein.

In some embodiments, the substrate 62 may have a silicon oxide formed thereon, e.g., a native oxide. Because their presence can increase the contact resistance or even lead to an open circuit, prior to depositing a barrier structure on the substrate 62, some methods include a separate oxide removal or preclean process, which can be in situ or ex situ and can be wet or dry. Such removal process may increase process time and cost, and may also introduce undesirable contaminants such as fluorine. Advantageously, according to embodiments, forming the TiSi region 64 using a halide-free silane as the first silicon-containing precursor at the above indicated conditions including temperatures and pressure may obviate the need for such separate oxide removal process, among various additional unexpected benefits. This is realized by exposing the substrate to the first silicon-containing precursor as the first precursor prior to exposing the substrate to the first titanium-containing precursor, and further by using a silane gas as the first silicon-containing precursor. Thus, in some embodiments, the substrate comprises a native oxide formed thereon, and forming the TiSi region comprises exposing the oxide to the first silicon-containing precursor as a first precursor, during which the oxide on the substrate may be removed, thereby exposing an underlying silicon surface to the first titanium-containing precursor to initiate the deposition of TiSi. The first silicon-containing precursor effective for the oxide removal includes a halide-free inorganic silane, e.g., $SiH_4$ or $Si_2H_6$. Thus, using the silane as the silicon-containing precursor for the deposition of TiSi region synergistically provides an in situ solution for combining the oxide removal and the TiSi deposition in the same reactor chamber using the same reactants and as part of a single process sequence.

Still referring to FIGS. 5 and 6, the titanium-containing precursor and the nitrogen-containing precursor used for forming 56 the TiSiN region 66 can be the same or different from the titanium-containing precursor and the nitrogen-containing precursor used for forming the upper boundary region 32 described above with respect to FIGS. 1 and 4. Other process parameters can be similar to those described above with respect to forming the upper boundary region 32 (FIG. 4). However, the inventors have found that particularly high-performance barrier structures can be formed when the TiSiN region 66 is formed using the second silicon-containing precursor which comprises a chlorosilane or a silicon chloride e.g., $SiH_2Cl_2$, $SiHCl_3$, or $SiCl_4$. The inventors have found that, unlike forming the TiSi region, during which using a halide-free inorganic silane may facilitate stoichiometric tuning, TiSiN is desirably formed using a silicon and chlorine-containing precursor which results in self-limiting saturation of the surface by the silicon and chlorine-containing precursor under a wide variety of conditions. Without being bound to any theory, the self-limiting saturation of the chlorine-containing second silicon precursor may enable more precise control of composition in the direction of growth. In addition, better conformality may be achieved. As described above with respect to FIG. 1, forming the TiSiN region comprises alternatingly exposing the substrate to one or more cycles of the second titanium-containing precursor and the nitrogen-containing precursor, to first deposit monolayers or submonolayers of TiN, followed by exposing the substrate to one or more cycles of the second silicon-containing precursor to deposit monolayers or submonolayers of silicon on the one or more monolayers of TiN. In these embodiments, the last precursor the substrate is exposed to in forming the TiSiN region can be the silicon-containing precursor. Alternatingly depositing monolayers or submonolayers of TiN and monolayers or submonolayers of Si can be repeated a plurality of times. The resulting TiSiN region can have concentration gradients or differences in Ti, Si and/or N.

In some embodiments, forming the TiSiN region 66 comprises exposing the substrate to the second silicon-containing precursor as the last precursor. Exposing the substrate to the second silicon-containing precursor as the last precursor can form a TiSiN region 66 having concentration gradients in a layer normal direction of increasing silicon concentration, decreasing nitrogen concentration and decreasing titanium concentration. The inventors have found that one or more of these concentration gradients can enhance the diffusion barrier performance and Ohmic contact of the resulting barrier structure, e.g., when a tungsten-based contact is formed thereon. These and other benefits can be realized when the TiSiN region 66 is formed a relatively high substrate temperature of 400° C. to 800° C., 450° C. to 750° C., 500° C. to 700° C., 550° C. to 650° C., or in a range defined by any of these values, for instance about 600° C., according to embodiments.

According to embodiments, a ratio of the number of cycles (p in FIG. 1) of the second titanium-containing precursor or the nitrogen-containing precursor to the number of cycles (q in FIG. 1) of the silicon-containing precursors is 5:1, 6:1, 7:1, 8:1, 9:1, 10:1 or a ratio in a range defined by any of these values. Under the combination of process conditions described herein for forming the TiSiN region 66, the ratio of the cycles of the precursors is such that the silicon is present in the TiSiN region 66 at an average concentration exceeding about 10%, 15%, 20%, 25%, 30%, 35%, 40%, or a value in a range defined by any of these values, on the basis of an atomic concentration in the TiSiN region 66.

In addition, in embodiments where the TiSiN region 66 is formed by forming one or more monolayers of TiN followed by forming one or more monolayers of silicon, the gradient in silicon concentration is such that the surface region has a silicon concentration that is higher than the average concentration, and the region interfacing with the underlying TiSi region 64 has a silicon concentration that is lower relative to the average concentration. For example, the surface region of the TiSiN region 66 can have a silicon concentration exceeding 20%, 40%, 60%, 80%, 99% or a value in a range defined by any of these values, on the basis of an atomic concentration in the TiSiN region 66. The region interfacing with the underlying TiSi region 64 can have a silicon concentration lower than 20%, 15%, 10%, 5%, 1% or a value in a range defined by any of these values, on the basis of an atomic concentration in the TiSiN region 66. When the TiSiN region 66 is formed as disclosed herein, the upper region of the TiSiN region 66, which may be more silicon-rich compared to lower regions, may form lower resistance contact with a metal formed thereon and may provide improved resistance to diffusion of chemical elements used in forming a metal contact thereon. For example, when a tungsten-based contact is formed on the TiSiN region 66, the resulting TiSiN region 66 forms an improved diffusion barrier to fluorine used in forming tungsten-based contact. In addition, the resulting TiSiN region 66 provides an improved diffusion barrier functionality against dopants from the underlying Si-containing active layer, e.g., polysilicon or single-crystal silicon having doped regions. In addition, the Si-rich surface of the TiSiN region 66 provides an improved contact resistance with the metal contact formed thereon.

In various embodiments, the TiSiN region 66 is at least partially amorphous. In some embodiments, the TiSiN region 66 comprises nanocrystalline regions formed by two or more of Ti, Si and N. For example, the TiSiN region 66 may include TiSi, TiN, SiN, or TiSiN nanocrystals in an amorphous matrix. In some other embodiments, the TiSiN region 66 is substantially entirely amorphous.

Advantageously, when the diffusion barrier structure comprising TiSi and TiSiN regions 64, 66 are formed as disclosed herein, the overall thickness of the barrier structure can be reduced substantially, such that a combined thickness of the TiSi region and the TiSiN does not exceed about 10 nm, 8 nm, 6 nm, 4 nm, 3 nm, 2 nm, or has a value in a range defined by any of these values. The thickness of the TiSi region 64 does not exceed about 4 nm, 3 nm, 2 nm, 1 nm, 0.5 nm, or has a value in a range defined by any of these values. The thickness of the TiSiN region 66 does not exceed about 6 nm, 5 nm, 4 nm, 3 nm, 1 nm, or has a value in a range defined by any of these values. A ratio of the thicknesses of the TiSi region 64 and the TiSiN region 66 is greater than about 0.2, 0.4, 0.6, 0.8, 1.0, 1.2, 1.4, or a value in a range defined by any of these values. For example, an example stack may include a TiSi region 64 having a thickness of about 1-2 nm and a TiSiN region 66 having a thickness of about 2-3 nm, for a combined thickness of about 3-4 nm.

Advantageously, when the diffusion barrier structure comprising TiSi and TiSiN regions 64, 66 are formed as disclosed herein, one or more of the barrier performance, the vertical conductivity and the lateral conductivity that are equivalent or better than a diffusion barrier structure having a TiSiN layer alone with twice the thickness. Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention.

Such simple modifications and improvements of the various embodiments disclosed herein are within the scope of the disclosed technology, and the specific scope of the disclosed technology will be additionally defined by the appended claims.

In the foregoing, it will be appreciated that any feature of any one of the embodiments can be combined or substituted with any other feature of any other one of the embodiments.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while features are presented in a given arrangement, alternative embodiments may perform similar functionalities with different components and/or sensor topologies, and some features may be deleted, moved, added, subdivided, combined, and/or modified. Each of these features may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

| List of Reference Numerals | | | |
|---|---|---|---|
| 1 | Process step | 30 | Coating |
| 2 | Process step | 31 | Boundary region |
| 2.1 | Substep | 32 | Boundary region |
| 2.2 | Substep | 33 | Core region |
| 3 | Process step | 34 | Surface |
| 3.1 | Substep | | |
| 3.2 | Substep | | |
| 4 | Transport step | D | Axis of rotation |
| 5 | Heating step | | |
| 6 | Transport step | | |
| 10 | Process chamber | k | Cycle number |
| 11 | Reactor housing | l | Cycle number |
| 12 | Gas inlet element | m | Cycle number |
| 13 | Gas outlet opening | n | Cycle number |
| 14 | Gas outlet | p | Cycle number |

-continued

List of Reference Numerals

| 15 | Heater | q | Cycle number |
|---|---|---|---|
| 16 | Susceptor | r | Cycle number |
| 17 | Substrate | | |
| 18 | Chamber | | |
| 19 | Chamber | 52 | Providing process |
| 20 | Chamber | 54 | Forming process |
| 21 | Chamber | 56 | Forming process |
| 22 | Mass flow controller | 66 | Substrate |
| 23 | Mass flow controller | 64 | TiSi region |
| 24 | Mass flow controller | 66 | TiSiN region |
| 25 | Mass flow controller | | |

What is claimed is:

1. A method of forming an electrically conductive diffusion barrier, the method comprising:
    providing a substrate comprising an exposed silicon surface formed of monocrystalline silicon or polycrystalline silicon in a reaction chamber;
    forming a titanium silicide (TiSi) region of the diffusion barrier directly on the exposed silicon surface of the substrate by alternatingly exposing the substrate to a first titanium-containing precursor and a first silicon-containing precursor; and
    forming a titanium silicon nitride (TiSiN) region of the diffusion barrier directly on the TiSi region by alternatingly exposing the substrate to a second titanium-containing precursor, a nitrogen-containing precursor and a second silicon-containing precursor,
    wherein the TiSi region and the TiSiN region are formed in situ, and
    wherein a combined thickness of the TiSi region and the TiSiN region does not exceed 10 nm.

2. The method of claim 1, wherein the TiSi region and the TiSiN region are formed at a temperature greater than 550° C. to about 700° C.

3. The method of claim 1, wherein forming the TiSi region and forming the TiSiN region comprises thermally reacting respective precursors without using plasma.

4. The method of claim 1, wherein the first silicon-containing precursor comprises an inorganic, halide-free silane.

5. The method of claim 4, wherein the inorganic, halide-free silane is a first precursor the substrate is exposed to.

6. The method of claim 4, wherein the substrate comprises a native oxide formed thereon, and wherein forming the TiSi region comprises removing the native oxide by exposing the substrate to the inorganic, halide-free silane, thereby exposing the silicon surface.

7. The method of claim 4, wherein the second silicon-containing precursor comprises chlorine.

8. The method of claim 1, wherein the first titanium-containing precursor and the second titanium-containing precursor are different.

9. The method of claim 1, wherein forming the TiSi region comprises purging the reaction chamber between exposing the substrate to the first titanium precursor and to the first silicon-containing precursor.

10. The method of claim 1, wherein forming the TiSiN region comprises purging the reaction chamber between exposing the substrate to the second titanium-containing precursor and to the nitrogen-containing precursor, and between exposing the substrate to the nitrogen-containing precursor and the second silicon-containing precursor.

11. The method of claim 1, wherein forming the TiSiN region comprises exposing the substrate to one or more cycles of the second titanium-containing precursor and the nitrogen-containing precursor to deposit one or more monolayers/submonolayers of TiN, followed by exposing the substrate to one or more cycles of the second silicon-containing precursor to deposit one or more monolayers/submonolayers of silicon.

12. The method of claim 11, wherein forming the TiSiN region comprises alternatingly depositing the one or more monolayers/submonolayers of TiN and the one or more monolayers/submonolayers of silicon.

13. The method of claim 11, wherein forming the TiSiN region comprises completing the deposition by exposing the substrate to a plurality of exposures to the second silicon-containing precursor.

14. The method of claim 11, wherein forming the TiSiN region comprises forming concentration gradients in a layer thickness direction of increasing silicon concentration, decreasing nitrogen concentration and decreasing titanium concentration towards an upper surface the electrically conductive diffusion barrier.

15. The method of claim 1, wherein the substrate comprises doped polysilicon regions, and forming the TiSi region comprises forming a Schottky barrier at an interface between the doped polysilicon regions and the TiSi region.

16. The method of claim 1, further comprising forming a metal on the TiSiN region using a fluorine-containing precursor.

17. A method of forming an electrically conductive diffusion barrier, the method comprising:
    providing a substrate comprising an exposed silicon surface formed of monocrystalline silicon or polycrystalline silicon in a reaction chamber;
    thermally forming a titanium silicide (TiSi) region of the diffusion barrier directly on the exposed silicon surface of the substrate by alternatingly exposing the substrate to a first silicon-based precursor and a first titanium-containing precursor; and
    thermally forming a titanium silicon nitride (TiSiN) region of the diffusion barrier directly on the TiSi region by alternatingly exposing the substrate to a second titanium-containing precursor, a nitrogen-containing precursor and a second silicon-containing precursor, wherein the substrate is exposed to the second silicon-containing precursor as a last precursor in forming the TiSiN region,
    wherein a combined thickness of the TiSi region and the TiSiN region does not exceed 10 nm.

18. The method of claim 17, wherein the first silicon-based precursor comprises $SiH_4$ or $Si_2H_6$.

19. The method of claim 18, wherein the substrate comprises an oxide formed thereon, and wherein forming the TiSi region comprises removing the oxide in situ in the reaction chamber, thereby exposing the silicon surface, prior to exposing the substrate to the first titanium-containing precursor.

20. The method of claim 17, wherein the second silicon-containing precursor comprises $SiH_2Cl_2$, $SiHCl_3$ or $SiCl_4$.

21. The method of claim 17, wherein the TiSi region and the TiSiN region are formed on the substrate at a temperature between about 500° C. and about 700° C.

22. The method of claim 17, wherein forming the TiSiN region comprises forming a TiN region by subjecting the substrate to a plurality of alternating exposures to the second titanium-containing precursor and the nitrogen-containing precursor in sequence, followed by forming a Si region by subjecting the substrate to one or more exposures to the second silicon-containing precursor in sequence.

23. The method of claim 22, wherein a ratio of the plurality of alternating exposures to the second titanium-containing precursor or the nitrogen-containing gas to the one or more exposures to the second silicon-containing precursor exceeds 5.

24. The method of claim 1, further comprising depositing tungsten directly on the TiSiN region.

25. A method of forming an electrically conductive diffusion barrier, the method comprising:
providing a substrate comprising an exposed silicon surface formed of monocrystalline silicon or polycrystalline silicon in a reaction chamber;
forming a titanium silicide (TiSi) region of the diffusion barrier directly on the exposed silicon surface of the substrate by alternatingly exposing the substrate to a first titanium-containing precursor and a first silicon-containing precursor;
forming a titanium silicon nitride (TiSiN) region of the diffusion barrier on the TiSi region by alternatingly exposing the substrate to a second titanium-containing precursor, a nitrogen-containing precursor and a second silicon-containing precursor,
wherein the TiSi region and the TiSiN region are formed in situ, and
wherein a combined thickness of the TiSi region and the TiSiN region does not exceed 10 nm; and
depositing tungsten directly on the TiSiN region.

26. The method of claim 25, wherein the first silicon-containing precursor comprises an inorganic, halide-free silane.

27. The method of claim 26, wherein the substrate comprises a native oxide formed thereon, and wherein forming the TiSi region comprises removing the native oxide by exposing the substrate to the inorganic, halide-free silane, thereby exposing the silicon surface.

28. The method of claim 25, wherein the second silicon-containing precursor comprises chlorine.

29. The method of claim 25, wherein the second silicon-containing precursor is a last precursor in forming the TiSiN region.

30. The method of claim 29, wherein forming the TiSiN region comprises subjecting the substrate to a plurality of exposures to the second silicon-containing precursor as a last precursor prior to depositing the tungsten.

* * * * *